United States Patent
Kim et al.

(10) Patent No.: US 12,301,175 B2
(45) Date of Patent: May 13, 2025

(54) TRANSFORMER FOR LOW LOSS AND APPARATUS INCLUDING THE SAME

(71) Applicant: Samsung Electronics Co., Ltd., Suwon-si (KR)

(72) Inventors: Kihyun Kim, Suwon-si (KR); Sangho Lee, Suwon-si (KR); Jinhyun Kim, Suwon-si (KR); Hyunchul Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 204 days.

(21) Appl. No.: 17/963,693

(22) Filed: Oct. 11, 2022

(65) Prior Publication Data

US 2023/0031672 A1    Feb. 2, 2023

Related U.S. Application Data

(63) Continuation of application No. PCT/KR2021/018978, filed on Dec. 14, 2021.

(30) Foreign Application Priority Data

Dec. 15, 2020  (KR) .......... 10-2020-0175726

(51) Int. Cl.
*H03H 7/00* (2006.01)
*H03F 1/56* (2006.01)
*H03F 3/195* (2006.01)

(52) U.S. Cl.
CPC .......... *H03F 1/565* (2013.01); *H03F 3/195* (2013.01); *H03F 2200/451* (2013.01)

(58) Field of Classification Search
CPC ........ H01F 2027/2809; H01F 27/2804; H01F 27/28; H01F 30/06; H01F 30/08; H03H 7/38; H03H 7/00
See application file for complete search history.

(56) References Cited

U.S. PATENT DOCUMENTS 6,801,114 B2    10/2004    Yang et al.
7,978,041 B2    7/2011    Bertilsson
(Continued)

FOREIGN PATENT DOCUMENTS

JP    H05-006829 A    1/1993
JP    4010818 B2    11/2007
(Continued)

OTHER PUBLICATIONS

Extended Search Report dated Jun. 11, 2024, issued in European Patent Application No. 21907057.0-1211.
(Continued)

*Primary Examiner* — Stephen E. Jones
(74) *Attorney, Agent, or Firm* — Jefferson IP Law, LLP

(57) ABSTRACT

The disclosure relates to a pre-$5^{th}$-Generation (5G) or 5G communication system to be provided for supporting higher data rates Beyond $4^{th}$-Generation (4G) communication system, such as long term evolution (LTE). A transformer is provided. The transformer includes a first primary inductor, a second primary inductor, and a secondary inductor. The secondary inductor may be disposed between the first primary inductor and the second primary inductor. The secondary inductor may be disposed spaced apart from the first primary inductor and the second primary inductor.

16 Claims, 11 Drawing Sheets

(56) References Cited

U.S. PATENT DOCUMENTS

| | | |
|---|---|---|
| 8,331,978 B2 | 12/2012 | Bhagat et al. |
| 9,985,591 B2 | 5/2018 | Goldblatt et al. |
| 2003/0146816 A1 | 8/2003 | Furumiya et al. |
| 2006/0044844 A1 | 3/2006 | Utsuno et al. |
| 2009/0305647 A1 | 12/2009 | Mckay et al. |
| 2010/0248647 A1 | 9/2010 | Wachi |
| 2011/0109417 A1 | 5/2011 | Bertram et al. |
| 2012/0194403 A1 | 8/2012 | Cordier et al. |
| 2012/0319779 A1 | 12/2012 | Kim et al. |
| 2013/0335182 A1 | 12/2013 | Zybura et al. |
| 2014/0138792 A1 | 5/2014 | Lo et al. |
| 2014/0347154 A1 | 11/2014 | Schmelzer et al. |

FOREIGN PATENT DOCUMENTS

| | | |
|---|---|---|
| JP | 2010-074598 A | 4/2010 |
| JP | 2010-239415 A | 10/2010 |

OTHER PUBLICATIONS

Sunbo Shim et al., A 1-W, 800-MHZ, Switch-mode CMOS RF Power Amplifier Using an On-Chip Transformer with Double Primary Sides, School of EECS, Korea Advanced Institute of Science and Technology (KAIST), RWS 2009.

Korean Office Action dated Nov. 8, 2024, issued in Korean Patent Application No. 10-2020-0175726.

Korean Notice of Patent Grant dated Mar. 16, 2025, issued in Korean Patent Application No. 10-2020-0175726.

TRANSFORMER FOR LOW LOSS AND APPARATUS INCLUDING THE SAME

CROSS-REFERENCE TO RELATED APPLICATION(S)

This application is a continuation application, claiming priority under § 365(c), of an International application No. PCT/KR2021/018978, filed on Dec. 14, 2021, which is based on and claims the benefit of a Korean patent application number 10-2020-0175726, filed on Dec. 15, 2020, in the Korean Intellectual Property Office, the disclosure of which is incorporated by reference herein in its entirety.

TECHNICAL FIELD

The disclosure relates to a wireless communication system. More particularly, the disclosure relates to a transformer for a low loss in the wireless communication system, and an apparatus including the transformer.

BACKGROUND ART

To meet the demand for wireless data traffic having increased since deployment of 4$^{th}$ generation (4G) communication systems, efforts have been made to develop an improved 5$^{th}$ generation (5G) or pre-5G communication system. Therefore, the 5G or pre-5G communication system is also called a 'Beyond 4G Network' or a 'Post LTE System'.

The 5G communication system is considered to be implemented in higher frequency (millimeter (mm) Wave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

An electronic device which transmits and receives a signal of a millimeter Wave (mmWave) band in a wireless communication system may include a radio frequency integrated chip (RFIC) for radio frequency (RF) signal processing. In this case, the RFIC may include a transformer and an amplifier (e.g., a differential amplifier), and the transformer may be coupled to the amplifier at an output stage. In order to minimize a loss in designing of the RFIC, impedance matching may be required between the transformer and the amplifier. In this case, for the impedance matching, there is a need to additionally dispose a capacitor at an input stage and the output stage, and a loss may occur due to the added capacitor. For example, an element added for the impedance matching may cause a loss, resulting in lower efficiency. Accordingly, in order to minimize the loss caused by the matching of the transformer, a structure of a high-efficiency transformer is required even if an additional element is not added.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

Aspects of the disclosure are to address at least the above-mentioned problems and/or disadvantages and to provide at least the advantages described below. Accordingly, an aspect of the disclosure is to provide a structure capable of minimizing a matching loss by using a structure of a transformer including a dual primary inductor in a wireless communication system.

In addition, the disclosure may minimize a size of a radio frequency integrated circuit (RFIC) through the transformer including the dual primary inductor in the wireless communication system.

Another aspect of the disclosure is to provide a structure capable of improving performance of the transformer by using the structure of the transformer including the dual primary inductor in the wireless communication system.

Additional aspects will be set forth in part in the description which follows and, in part, will be apparent from the description, or may be learned by practice of the presented embodiments.

Solution to Problem

In accordance with an aspect of the disclosure, a transformer is provided. The transformer includes a first primary inductor, a second primary inductor, and a secondary inductor. The secondary inductor may be disposed between the first primary inductor and the second primary inductor. The secondary inductor may be disposed spaced apart from the first primary inductor and the second primary inductor.

In accordance with another aspect of the disclosure, an electronic device of a wireless communication system is provided. The electronic device includes a plurality of radio frequency integrated circuits (RFICs). At least one RFIC among the plurality of RFICs may include a transformer. The transformer may include a first primary inductor, a second primary inductor, and a secondary inductor. The secondary inductor may be disposed between the first primary inductor and the second primary inductor. The secondary inductor may be disposed spaced apart from the first primary inductor and the second primary inductor.

Advantageous Effects of Invention

An apparatus, according to various embodiments of the disclosure, may enable impedance matching with an amplifier without having to dispose an additional element through a specific structure of a primary inductor, and may minimize a loss.

An apparatus, according to various embodiments of the disclosure, may minimize a size of a radio frequency integrated circuit (RFIC) through a primary inductor having a specific structure.

An apparatus, according to various embodiments of the disclosure, may improve performance of a transformer through a specific structure of a primary inductor.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

BEST MODE FOR CARRYING OUT THE INVENTION

Figure 1:
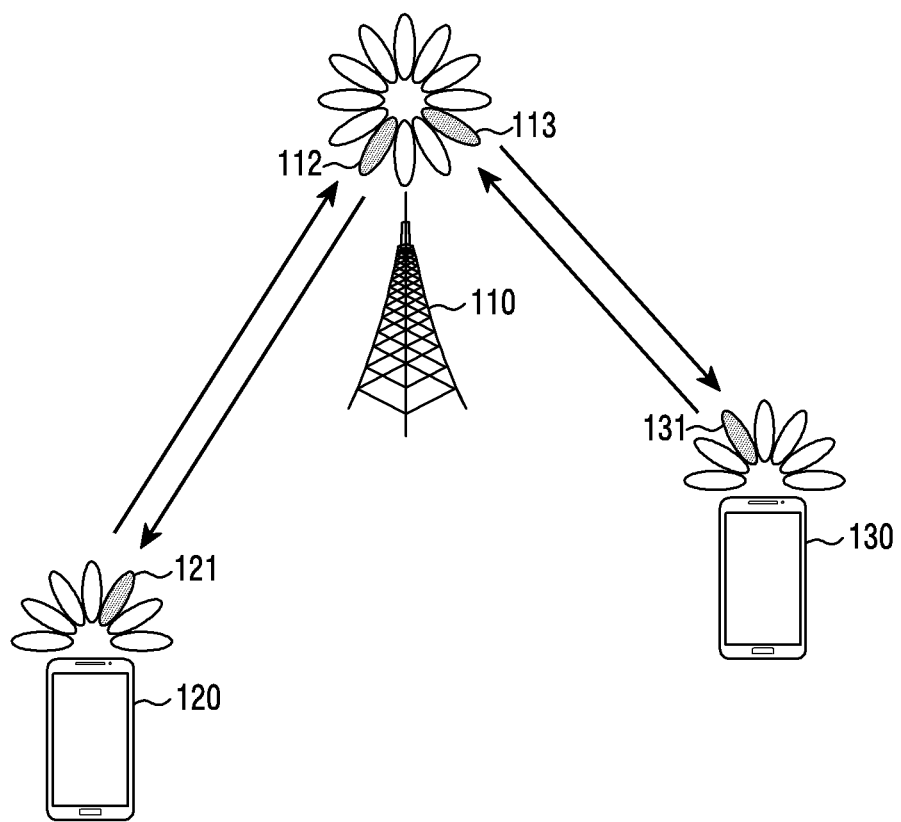
FIG. 1 illustrates a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Terms used in the disclosure are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the disclosure. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the disclosure should not be interpreted to exclude the embodiments of the disclosure.

A hardware-based approach is described for example in the various embodiments of the disclosure described hereinafter. However, since the various embodiments of the disclosure include a technique in which hardware and software are both used, a software-based approach is not excluded in the embodiments of the disclosure.

Terms used hereinafter to refer to parts of an electronic device (e.g., a board structure, a substrate, a printed circuit board (PCB), a flexible PCB (FPCB), a module, an antenna, an antenna element, a circuit, a processor, a chip, a component, a device), a shape of the parts (e.g., a construction body, a construction member, a support unit, a contact unit, a protrusion, an opening) a connection unit between construction bodies (e.g., a connection line, a feeding line, a connection unit, a contact unit, a feeding unit, a support unit, a contact construction body, a conductive member, an assembly), and a circuitry (e.g., a PCB, an FPCB, a signal line, a feeding line, a data line, an RF signal line, an antenna line, an RF path, an RF module, an RF circuit), or the like are exemplified for convenience of explanation. Therefore, the disclosure is not limited to the terms described below, and thus other terms have the same technical meaning may also be used. In addition, the term ' . . . unit', ' . . . device', ' . . . member', ' . . . body', or the like may imply at least one configuration or may imply a unit of processing a function.

In the electronic device using the signal of the mmWave band, the electronic device may include a radio frequency integrated circuit (RFIC) for signal processing. In this case, an amplifier (e.g., a differential amplifier) and a transformer may be disposed inside the RFIC. For impedance matching between the amplifier and the transformer, an element (e.g., a capacitor) may be additionally disposed. However, since the element is additionally disposed for impedance matching, a loss may occur due to the additional element, which may result in low efficiency of the electronic device.

Hereinafter, the disclosure proposes a structure in which a primary inductor to be disposed to an input stage of a transformer is formed in a dual manner to minimize a loss through impedance matching without having to dispose an additional element. Since the primary inductor is formed in the dual manner to achieve impedance matching through a parasitic capacitor formed between a primary inductor and a secondary inductor, the loss may be minimized.

However, the structure according to the disclosure is not limited thereto. For example, the transformer according to an embodiment of the disclosure may include one primary inductor and a dual secondary inductor. As another example, the transformer according to an embodiment of the disclosure may include at least three multiple primary inductors, instead of the dual primary inductor. As another example, the transformer according to an embodiment of the disclosure may include at least three multiple secondary inductors, instead of the dual secondary inductor. For convenience of explanation, the following description may focus on a transformer including a dual primary inductor and one secondary inductor.

FIG. 1 illustrates a wireless communication system according to an embodiment of the disclosure. As some of nodes which use a wireless channel in a wireless communication system, a base station 110, a terminal 120, and a terminal 130 are exemplified in FIG. 1. Although only one base station is illustrated in FIG. 1, another base station identical to or different from the base station 110 may be further included.

Referring to FIG. 1, the base station 110 is a network infrastructure which provides a radio access to the terminals 120 to 130. The base station 110 has a coverage defined as a specific geographic region according to a distance capable of transmitting a signal. In addition to the term 'base station', the base station 110 may be referred to as an 'access point (AP)', an 'eNodeB (eNB)', a '5$^{th}$ generation (5G) node', a 'wireless point', a 'transmission/reception point (TRP)', or other terms having equivalent technical meanings.

As a device used by a user, each of the terminals 120 to 130 communicates with the base station 110 through the wireless channel Optionally, at least one of the terminals 120 to 130 may operate without user involvement. For example, as a device for performing machine type communication (MTC), at least one of the terminals 120 to 130 may not be carried by the user. In addition to the term 'terminal', each of the terminals 120 to 130 may be referred to as a 'user equipment (UE)', a 'mobile station', a 'subscriber station', a 'customer premise equipment (CPE)', a 'remote terminal', a 'wireless terminal', an 'electronic device', a 'user device', or other terms having equivalent technical meanings.

The base station 110, the terminal 120, and the terminal 130 may transmit and receive a radio signal at a millimeter Wave (mmWave) band (e.g., 28 GHz, 30 GHz, 38 GHz, 60 GHz). In this case, to improve a channel gain, the base station 110, the terminal 120, and the terminal 130 may perform beamforming Herein, the beamforming may include transmission beamforming and reception beamforming. For example, the base station 110, the terminal 120, and the terminal 130 may assign a directivity to a transmission signal and or a reception signal. For this, the base station 110 and the terminals 120 and 130 may select serving beams 112, 113, 121, and 131 through a beam search or beam management procedure. After the serving beams 112, 113, 121, and 131 are selected, subsequent communication may be performed through a resource having a quasi co-located (QCL) relation with a resource used to transmit the serving beams 112, 113, 121, and 131.

The structure of the transformer according to an embodiment of the disclosure may be used in an electronic device which transmits or receives a signal of an mmWave band. For example, when the base station 110 of FIG. 1 transmits or receives the signal of the mmWave band, a transformer disposed to the base station 110 may be formed in a transformer structure according to an embodiment of the disclosure. As another example, when the terminals 120 and 130 of FIG. 1 receive the signal of the mmWave band, a transformer disposed to the terminals 120 and 130 may be formed in a transformer structure according to an embodiment of the disclosure.

Figure 2A:
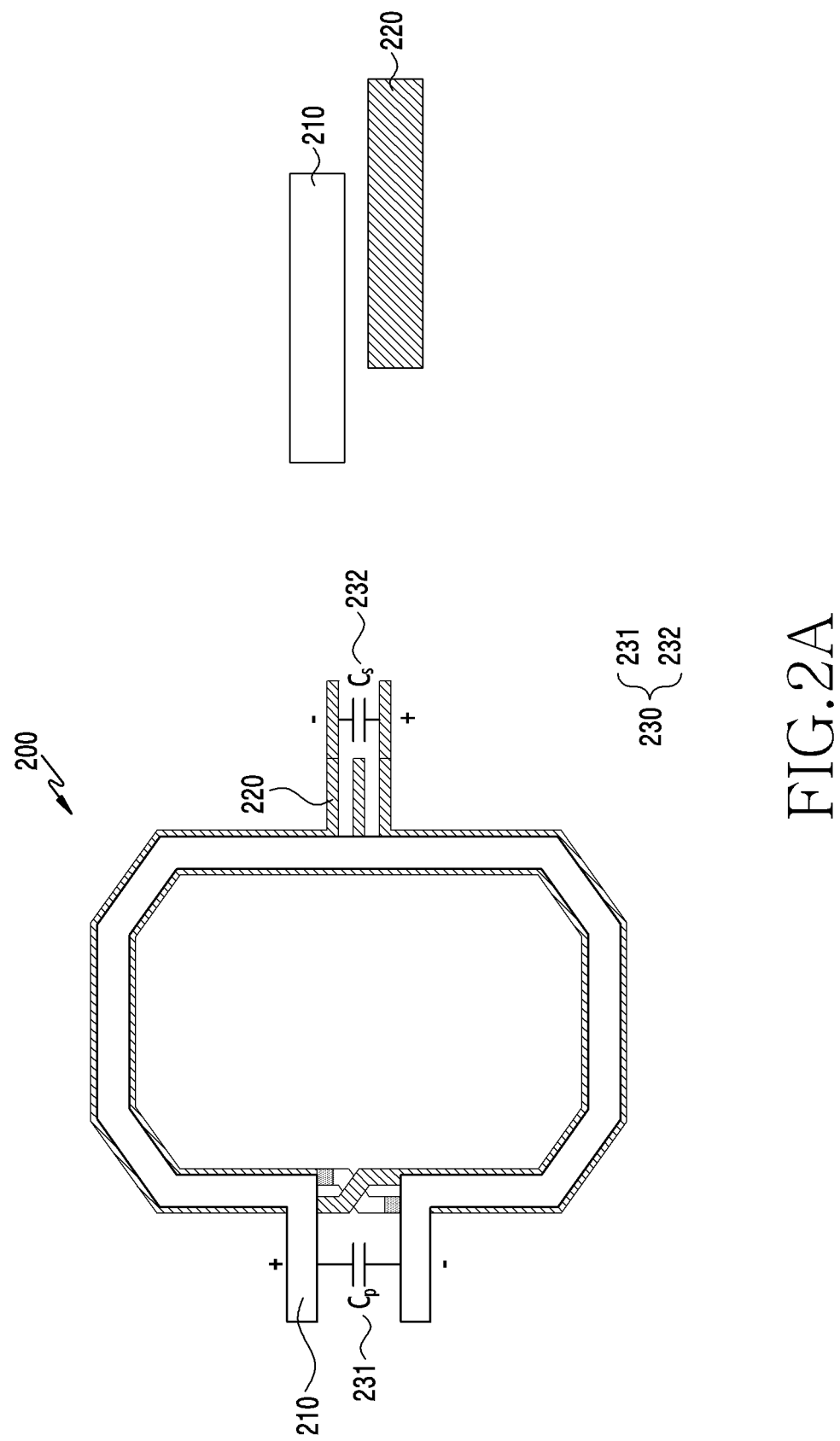
FIG. 2A illustrates a transformer structure for describing a transformer according to an embodiment of the disclosure.
Figure 2B:
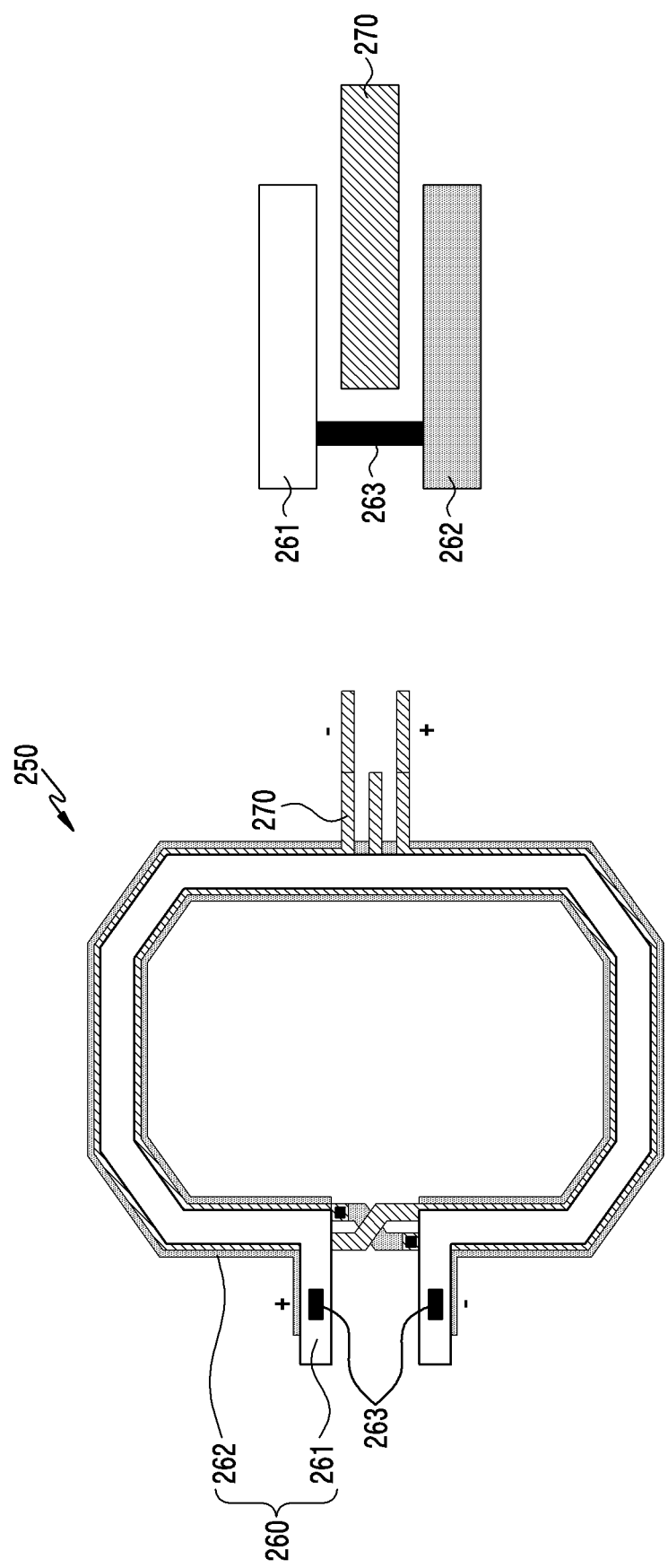
FIG. 2B illustrates a transformer structure according to an embodiment of the disclosure.

Hereinafter, a structure of a transformer according to an embodiment of the disclosure will be described with reference to FIG. 2A and FIG. 2B, compared to the legacy transformer structure.

FIG. 2A illustrates a transformer structure for describing a transformer according to an embodiment of the disclosure. A left drawing of FIG. 2A illustrates a perspective view of the legacy transformer structure, viewed from above. A right drawing of FIG. 2A illustrates a perspective view of the legacy transformer structure, viewed from a side. For convenience of explanation, a transformer (i.e., a 1:2 transformer) which doubles an output voltage at an input stage is illustrated for example. However, embodiments of the disclosure are not limited to the transformer structure which provides a 1:2 gain. For example, the transformer structure according to an embodiment of the disclosure may also apply to a 1:n (n is 1, 2, 3, 4, . . . ) transformer.

Referring to the left drawing of FIG. 2A, the legacy transformer 200 may include a primary inductor 210, a secondary inductor 220, a primary capacitor 231, and a secondary capacitor 232. The transformer 200 may transform a voltage at an input stage of the primary inductor 210 to a voltage at an output stage of the secondary inductor 220. The primary capacitor 231 may be disposed to compensate for leakage caused by mutual inductance. The secondary capacitor 232 may be disposed for impedance matching with an amplifier coupled to the secondary inductor 220. In particular, if the amplifier coupled to the secondary inductor 220 of the transformer 200 is small in size, the secondary capacitor 232 may be required to decrease a magnitude of an input impedance at an input stage of the amplifier (i.e., an output stage of the transformer). However, since the primary capacitor 231 and the secondary capacitor 232 are additionally disposed, a loss may occur due to the primary capacitor 231 and the secondary capacitor 232.

Referring to the right drawing of FIG. 2A, the primary inductor 210 and the secondary inductor 220 are disposed in parallel such that a specific region overlaps. Accordingly, a parasitic capacitor $C_{para}$ is formed between the primary inductor 210 and the secondary inductor 220. Compared to the aforementioned structure of the legacy transformer 200 of FIG. 2A, a structure of a transformer in which a primary inductor is formed in a dual manner and a secondary inductor is disposed between two primary inductors (hereinafter, a dual primary inductor transformer) will be described according to an embodiment of the disclosure with reference to FIG. 2B.

FIG. 2B illustrates a transformer structure according to an embodiment of the disclosure.

Referring to FIG. 2B, an example of a transformer structure according to an embodiment of the disclosure is illustrated. A left drawing of FIG. 2B illustrates a perspective view of the legacy transformer structure, viewed from above. A right drawing of FIG. 2B illustrates a perspective view of the legacy transformer structure, viewed from a side. For convenience of explanation, a transformer (i.e., a 1:2 transformer) which doubles an output voltage at an input stage is illustrated for example. However, embodiments of the disclosure are not limited to the transformer structure which provides a 1:2 gain. For example, the transformer structure according to an embodiment of the disclosure may also apply to a 1:n (n is 1, 2, 3, 4, . . . ) transformer.

Referring to the left drawing of FIG. 2B, the transformer 250 may include a primary inductor 260 and a secondary inductor 270, and the primary inductor 260 may include a first primary inductor 261 and a second primary inductor 262. According to an embodiment of the disclosure, the first primary inductor 261 may be disposed to face a first face of the secondary inductor 270. For example, the first primary inductor 261 may be disposed to face the first face which is an upper face of the secondary inductor 270. According to an embodiment of the disclosure, the first primary inductor 261 may be disposed in parallel by being spaced apart by a first distance from the secondary inductor 270. However, the disclosure is not limited thereto, and according to another embodiment of the disclosure, the first primary inductor 261 may be disposed non-parallel to the secondary inductor 270. For example, metal layers of inductors may not be parallel to each other, or a space between the inductors may have a different permittivity, or a distance between the inductors may be different. However, even in this case, embodiments of the disclosure may also apply to a transformer having electrically parallel component vectors.

According to an embodiment of the disclosure, the first primary inductor 261 may be formed of metal. As described below, since the secondary inductor 270 may also be formed of metal, the parasitic capacitor $C_{para}$ may be formed due to current flowing through the first primary inductor 261 and the secondary inductor 270. A capacitance of the $C_{para}$ may be determined by at least one of metal constituting the first primary inductor 261 and secondary inductor 270, an area of a region in which the first primary inductor 261 and the secondary inductor 270 overlap, a first distance which is an interval between the first primary inductor 261 and the secondary inductor 270, and a permittivity of a first region which is a region between the first primary inductor 261 and the secondary inductor 270.

According to an embodiment of the disclosure, the second primary inductor 262 may have the same characteristic as the first primary inductor 261. For example, the second primary inductor 262 may be formed of the same metal as the first primary inductor 261. As another example, the second primary inductor 262 may be formed through the same physical structure (e.g., length, area, thickness, or the like) as the first primary inductor 261. In addition, as shown in the right drawing of FIG. 2B, the second primary inductor 262 may be coupled to the first primary inductor 261 by means of the connection unit 263. The second primary inductor 262 may be coupled to the first primary inductor 261, and thus one input stage may be shared. Although it is illustrated in FIG. 2B that the second primary inductor 262 has a wider area than the first primary inductor 261, this is only for convenience of explanation not for restriction of the disclosure. The disclosure is not limited thereto, and the second primary inductor 262 may not have the same characteristic as the first primary inductor 261. As described below, by considering a capacitance of the parasitic capacitor formed when the second primary inductor 262 is added, the second primary inductor 262 may be formed of metal different from the first primary inductor 261 or may be formed with a different physical structure.

According to an embodiment of the disclosure, the second primary inductor 262 may be disposed to face a second face of the secondary inductor 270. For example, the second primary inductor 262 may be disposed to face the second face which is a lower face of the secondary inductor 270. In other words, the second face may imply a direction opposite to the first face. According to an embodiment of the disclosure, the second primary inductor 262 may be disposed in parallel by being spaced apart by a second distance from the secondary inductor 270. However, the disclosure is not limited thereto, and according to another embodiment of the disclosure, the second primary inductor 262 may be disposed non-parallel to the secondary inductor 270.

According to an embodiment of the disclosure, the second primary inductor 262 may be formed of metal. As described below, since the secondary inductor 270 may also be formed of metal, a parasitic capacitor $C_{add}$ may be formed due to current flowing through the second primary inductor 262 and the secondary inductor 270. A capacitance of the $C_{add}$ may be determined by at least one of metal constituting the second primary inductor 262 and secondary inductor 270, an area of a region in which the second primary inductor 262 and the secondary inductor 270 overlap, a second distance which is an interval between the second primary inductor 262 and the secondary inductor 270, and a permittivity of a second region which is a region between the second primary inductor 262 and the secondary inductor 270.

According to an embodiment of the disclosure, the secondary inductor 270 may be formed of at least one metal layer. For example, if the transformer structure is the 1:2 transformer as shown in FIG. 2A and FIG. 2B, the secondary inductor 270 may be formed of two metal layers for transformation. However, the disclosure is not limited thereto. For example, the secondary inductor 270 may be formed of one metal layer. As another example, the secondary inductor 270 may be formed of three metal layers. In other words, the structure of the secondary inductor 270 may change by considering a usage type or the like of the transformer.

According to an embodiment of the disclosure, the secondary inductor 270 may include a first face in a direction facing the first primary inductor 261 and a second face in a direction facing the second primary inductor 262. In addition, the secondary inductor 270 may be disposed in parallel by being spaced apart by a first distance from the first primary inductor 261, and may be disposed in parallel by being spaced apart by a second distance from the second primary inductor 262. According to another embodiment of the disclosure, the secondary inductor 270 may be disposed non-parallel to the first primary inductor 261 and the second primary inductor 262.

According to an embodiment of the disclosure, a parasitic capacitor $C_{para}$ may be formed between the secondary inductor 270 and the first primary inductor 261, and a parasitic capacitor $C_{add}$ may be formed between the secondary inductor 270 and the second primary inductor 262. As described below with reference to FIG. 4, when the first primary inductor 261 and the second primary inductor 262 are completely identical inductors and a first region and a second region have the same permittivity, the $C_{add}$ may be formed to be the same as the $C_{para}$.

Referring to the right drawing of FIG. 2B, the first primary inductor 261 and second primary inductor 262 of the transformer 250 may be coupled by means of the connection unit 263. For example, the first primary inductor 261 may be vertically coupled to the connection unit 263, and the second primary inductor 262 may be vertically coupled to the connection unit 263. Accordingly, the first primary inductor 261 and the second primary inductor 262 may be disposed in parallel to each other. In addition, the first primary inductor 261, the second primary inductor 262, and the secondary inductor 270 may be disposed in parallel to each other.

As described above, in a dual primary inductor transformer structure according to an embodiment of the disclosure, a transformer may be formed by two primary inductors and one secondary inductor. Accordingly, a transformer capable of achieving impedance matching may be formed without having to additionally dispose a capacitor at an input stage and output stage of the transformer through not only a parasitic capacitor $C_{para}$ generated between one primary inductor and a secondary inductor but also an additional parasitic capacitor $C_{add}$ generated between another primary inductor and the secondary inductor. Since one primary inductor is further added, a capacitor is not additionally disposed, thereby minimizing a loss.

Hereinafter, a dual primary inductor transformer structure according to an embodiment of the disclosure and performance improvement of inductors according to the structure are described with reference to FIG. 3 and FIG. 4. However, the structure according to the disclosure is not limited thereto. For example, the transformer according to an embodiment of the disclosure may include one primary inductor and a dual secondary inductor. As another example, the transformer according to an embodiment of the disclosure may include at least three multiple primary inductors, instead of the dual primary inductor. As another example, the transformer according to an embodiment of the disclosure may include at least three multiple secondary inductors, instead of the dual secondary inductor. For convenience of explanation, the following description may focus on a transformer including a dual primary inductor and one secondary inductor.

Figure 3:
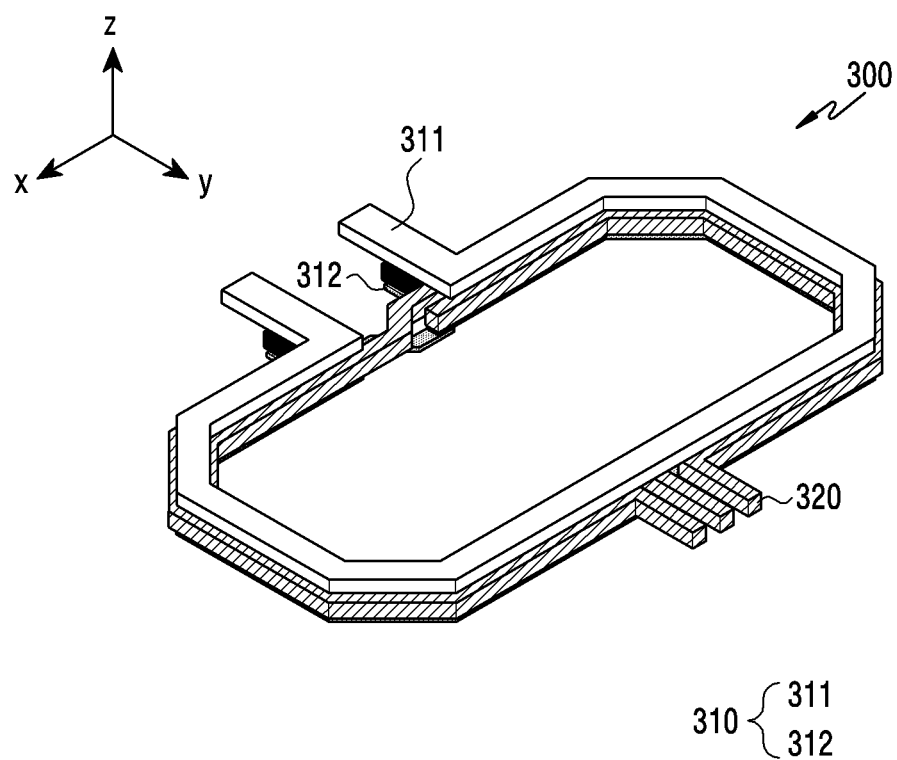
FIG. 3 illustrates a transformer structure according to an embodiment of the disclosure.

FIG. 3 illustrates a transformer structure according to an embodiment of the disclosure.

Referring to FIG. 3, it illustrates a perspective view of a transformer 300. In addition, a transformer (i.e., a 1:2 transformer) which doubles an output voltage at an input stage is illustrated for example as the transformer 300. However, embodiments of the disclosure are not limited to the transformer structure which provides a 1:2 gain. For example, the transformer structure according to an embodiment of the disclosure may also apply to a 1:n (n is 1, 2, 3, 4, ...) transformer.

Referring to FIG. 3, the transformer 300 may include a primary inductor 310 and a secondary inductor 320, and the primary inductor 310 may include a first primary inductor 311 and a second primary inductor 312. It may be understood that the transformer 300 of FIG. 3 is the same as the transformer 250 of FIG. 2B. For example, descriptions on the first primary inductor 261 of FIG. 2B may apply to descriptions on the first primary inductor 311 of FIG. 3. Accordingly, descriptions applicable identically will be omitted hereinafter.

Referring to FIG. 3, the first primary inductor 311 and the second primary inductor 312 may be disposed in parallel to an xy plane, and the secondary inductor 320 may be disposed in parallel to the xy plane. In addition, the first primary inductor 311, the second primary inductor 312, and the secondary inductor 320 may be formed as layers with respect to a z-axis. For example, a connection unit which couples the first primary inductor 311 and the second primary inductor 312 may be formed along the z-axis. However, the disclosure is not limited thereto, and even if the first primary inductor 310, the second primary inductor 312, or the secondary inductor 320 is formed non-parallel to the xy plane as described above, an embodiment of the disclosure may also apply when it is formed electrically in parallel.

Figure 4:
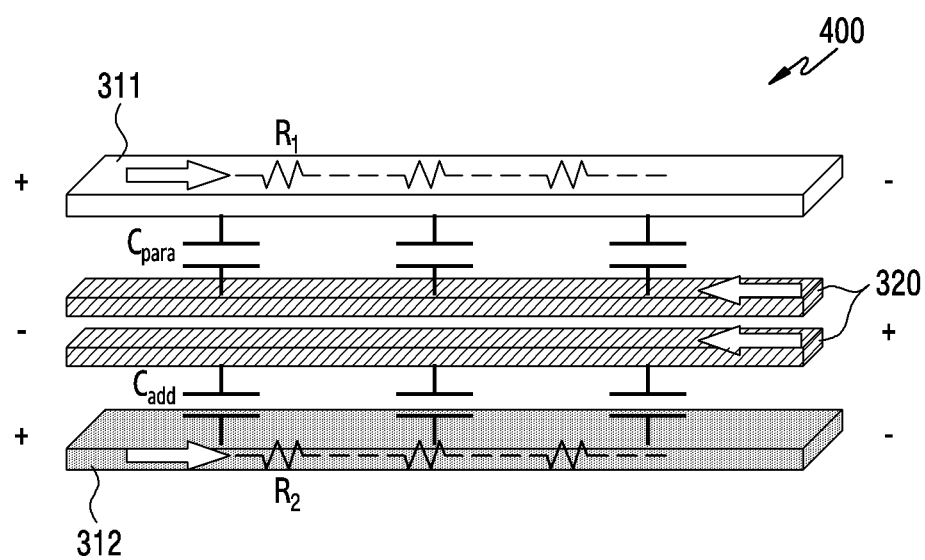
FIG. 4 is a partial perspective view of a transformer structure, viewed from a side, according to an embodiment of the disclosure.

FIG. 4 is a partial perspective view of a transformer structure, viewed from a side, according to an embodiment of the disclosure. For example, FIG. 4 may imply a partial perspective view of the transformer 300 of FIG. 3, viewed from a side.

Referring to FIG. 4, a transformer 400 substantially parallel. However, the disclosure is not limited thereto, and may also apply when it is electrically in parallel.

The transformer 400 may include a first primary inductor 311, a second primary inductor 312, and a secondary inductor 320, and the secondary inductor 320 may be formed of two metal layers. However, the disclosure is not limited thereto. For example, the secondary inductor 320 may be formed of one metal layer. As another example, the secondary inductor 320 may be formed of three or more metal layers. For example, the secondary inductor 320 may be formed by at least one metal layer.

According to an embodiment of the disclosure, a parasitic capacitor $C_{para}$ may be formed by the first primary inductor 311 and the secondary inductor 320, and $R_1$ may be formed by the first primary inductor 311. A capacitance of the $C_{para}$ may be determined by at least one of metal constituting the first primary inductor 311 and secondary inductor 320, an area of a region in which the first primary inductor 311 and the secondary inductor 320 overlap, a first distance which is an interval between the first primary inductor 311 and the secondary inductor 320, and a permittivity of a first region which is a region between the first primary inductor 311 and the secondary inductor 320. The $R_1$ may imply a resistor formed by the first primary inductor 311.

In addition, an additional parasitic capacitor $C_{add}$ may be formed by the second primary inductor 312 and the secondary inductor 320, and $R_2$ may be formed by the second primary inductor 312. A capacitance of the $C_{add}$ may be determined by at least one of metal constituting the second primary inductor 312 and secondary inductor 320, an area of a region in which the second primary inductor 312 and the secondary inductor 320 overlap, a second distance which is an interval between the second primary inductor 312 and the secondary inductor 320, and a permittivity of a second region which is a region between the second primary inductor 312 and the secondary inductor 320. The $R_2$ may imply a resistor formed by the second primary inductor 312. In other words, when the first primary inductor 311 and the second primary inductor 312 are the same inductor, the $R_2$ and the $R_1$ may imply the same resistor.

According to an embodiment of the disclosure, when the first primary inductor 311 is symmetric to the secondary inductor 320 and is formed under the same condition as the second primary inductor 312, the $C_{add}$ may be formed to be the same as the $C_{para}$. When it is formed under the same condition, this may be a case where the first distance and the second distance are identical, and a metal layer of the secondary inductor 320 corresponding to the first primary inductor 311 and a metal layer of the secondary inductor 320 corresponding to the second primary inductor 312 are formed of the same inductor.

According to an embodiment of the disclosure, the first primary inductor 311 and the second primary inductor 312 may be coupled by means of a connection unit (not shown), and the same electric potential may be formed as the same node. In addition, since the primary inductors 311 and 312 are coupled to an input stage, and the secondary inductor 320 is coupled to an output stage, the $R_1$ and the $R_2$ may imply resistors coupled in parallel, and the $C_{para}$ and the $C_{add}$ may imply capacitors coupled in parallel.

According to an embodiment of the disclosure, when the second primary inductor 312 is additionally disposed in parallel to the first primary inductor 311 and the secondary inductors 320, the performance of the inductors constituting the transformer 400 may be improved. In other words, when the second primary inductor 312 is coupled in parallel to the first primary inductor 311 and the secondary inductor 320, the performance of the transformer 400 may be improved. For example, when $Q_1$ denotes a quality factor of the first primary inductor 311 and $Q_2$ denotes a quality factor of the second primary inductor 312, the quality factor may be inversely proportional to resistance. In this case, since the $R_1$ and $R_2$ of FIG. 4 are coupled in parallel to reduce the resistance, the $Q_1$ and the $Q_2$ may be increased. For example, a frequency selection characteristic (quality) of the primary inductors 311 and 312 may be improved. As another example, when K denotes a coupling factor between the primary inductor 310 and the secondary inductor 320, the coupling factor may be inversely proportional to the product of inductances of the inductors. In this case, since the first primary inductor 311 and the second primary inductor 312 may be coupled in parallel, the inductance of the primary inductor 310 is reduced due to the parallel connection. Therefore, the K between 310 and secondary inductor 320 may be increased.

In other words, the dual primary inductor transformer according to an embodiment of the disclosure may improve performance of inductors. Since the second primary inductor 312 is added, quality factors the first primary inductor 311 and the second primary inductor 312 may be increased, and the coupling factor between the primary inductor 310 and the secondary inductor 320 may also be increased.

Hereinafter, it is described with reference to FIG. 5A and FIG. 5B that the $C_{add}$ generated when the second primary inductor 312 is additionally disposed is configured such that impedance matching is achieved with an impedance of an amplifier (not shown) coupled to the secondary inductor 320, thereby minimizing a loss.

Figure 5A:
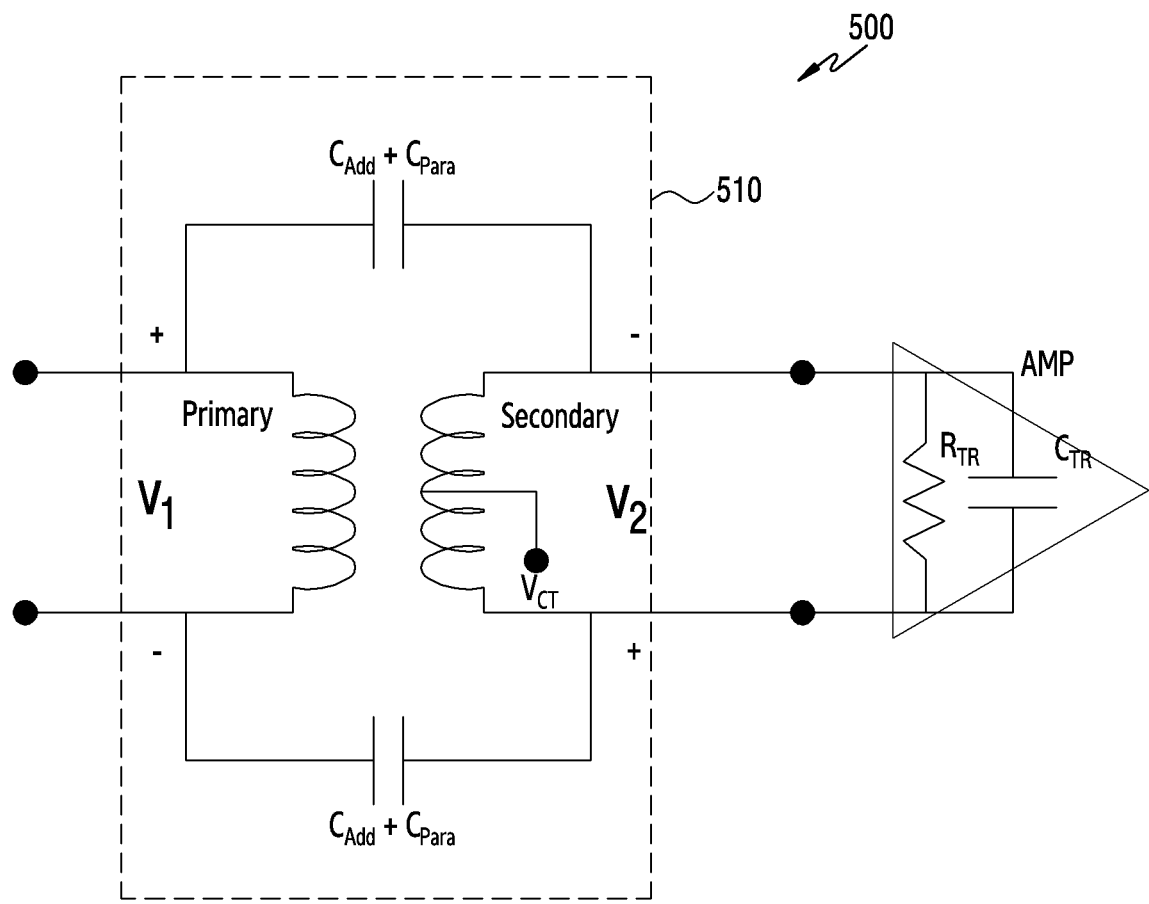
FIG. 5A illustrates a circuit diagram of an electronic device according to an embodiment of the disclosure.

FIG. 5A illustrates a circuit diagram of an electronic device according to an embodiment of the disclosure. FIG. 5A illustrates a circuit diagram of an electronic device including a dual primary inductor transformer according to an embodiment of the disclosure disclosed in FIG. 2B to FIG. 4. For convenience of explanation, a transformer (i.e., a 1:2 transformer) which doubles an output voltage at an input stage is illustrated for example in FIG. 5A. However, embodiments of the disclosure are not limited to the transformer structure which provides a 1:2 gain. For example, the transformer structure according to an embodiment of the disclosure may also apply to a 1:n (n is 1, 2, 3, 4, . . . ) transformer.

Referring to FIG. 5A, an electronic device 500 may include a transformer 510 and an amplifier. According to an embodiment of the disclosure, in the transformer 510, a first primary inductor and a second primary inductor may be disposed at an input stage by being replaced with one primary inductor, and a secondary inductor may be disposed at an output stage. In this case, when $v_1$ denotes a voltage at an input stage and $v_2$ denotes a voltage at the output stage, an electric potential for the $v_1$ may be defined as + when it is above the primary inductor and − when it is below the primary inductor, and an electric potential for the $v_2$ may be defined as − when it is above the secondary inductor and + when it is below the secondary inductor. As shown in FIG. 4, a parasitic capacitance $C_{para}$ formed between the first primary inductor and the secondary inductor may be represented to be coupled between the input stage and the output stage, and an additional parasitic capacitance $C_{add}$ formed between the second primary inductor and the secondary inductor may be represented to be coupled between the input stage and the output stage. In this case, referring to FIG. 4, since it may be understood that the $C_{para}$ and the $C_{add}$ are coupled in parallel, a capacitance sum of the two capacitors may be represented by $C_{add}+C_{para}$. According to an embodiment of the disclosure, the amplifier may be represented by one equivalent resistor $R_{TR}$ and one equivalent capacitor $C_{TR}$. In addition, $V_{CT}$ of FIG. 5A may imply a voltage at a center tap, which may be understood to be the same as a GND on AC.

As described above, the electronic device including the dual primary inductor transformer according to an embodiment of the disclosure may be represented by an equivalent circuit as shown in FIG. 5A. In this case, the $C_{add}$ formed by the added primary inductor (e.g., the second primary inductor) may be impedance-matched with the $C_{TR}$, which is an equivalent capacitor of the amplifier. Hereinafter, it is described in FIG. 5B that the $C_{add}$ may be replaced with capacitors coupled in parallel to the primary inductor and the secondary inductor, thereby enabling impedance matching of the $C_{add}$.

Figure 5B:
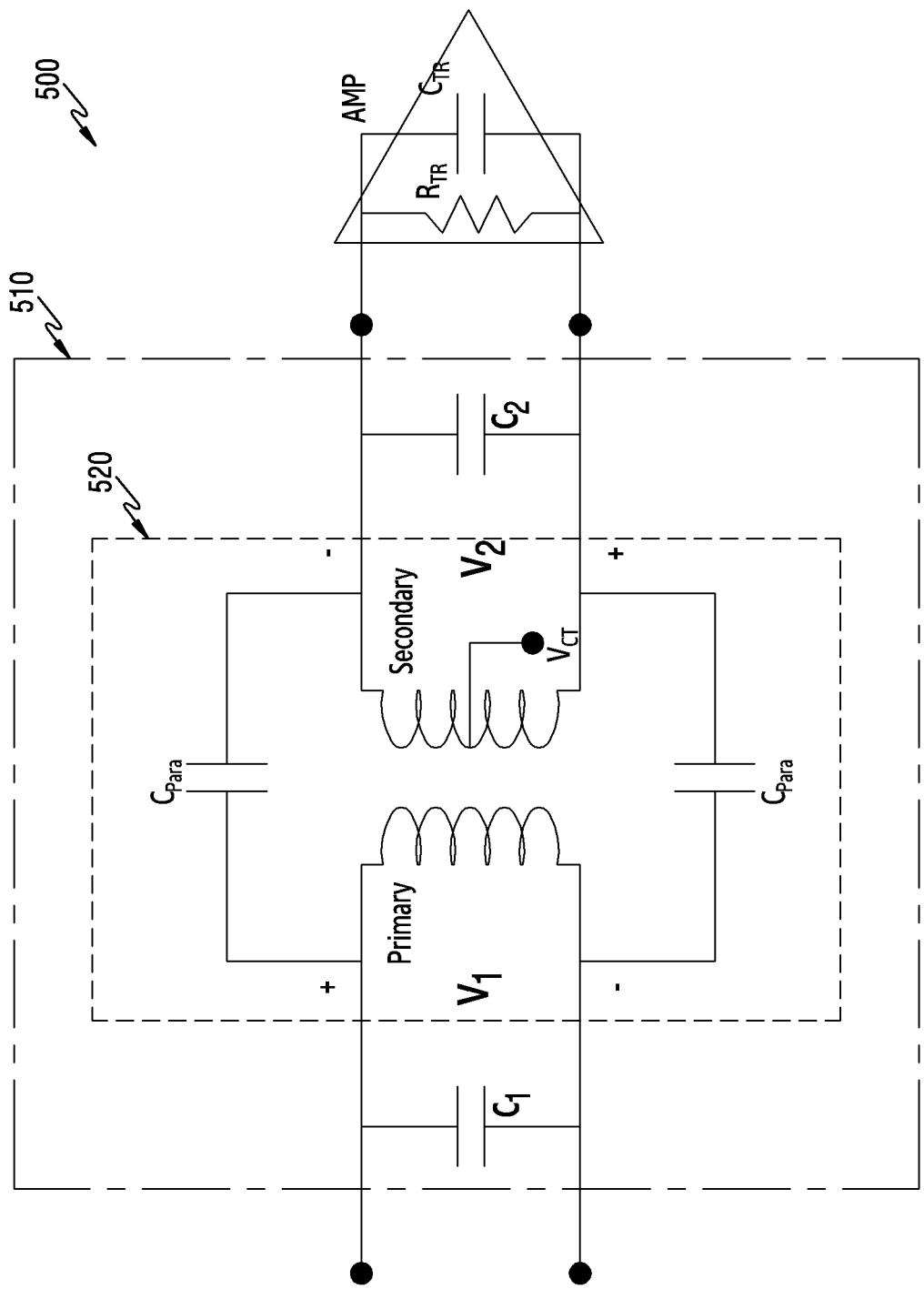
FIG. 5B illustrates a circuit diagram of an electronic device according to an embodiment of the disclosure.

FIG. 5B illustrates a circuit diagram of an electronic device according to an embodiment of the disclosure. It may be understood that an electronic device 500 of FIG. 5B is the same as the electronic device 500 of FIG. 5A. For example, a circuit of FIG. 5B may imply a circuit equivalent to the circuit of FIG. 5A.

Referring to FIG. 5B, the electronic device 500 may include a transformer 510. In this case, the transformer 510 may include a first structure 520, a first capacitor $C_1$, and a second capacitor $C_2$. According to an embodiment of the disclosure, the first structure 520 may imply the same structure as the legacy transformer (i.e., a transformer including one primary inductor and one secondary inductor). However, the first structure 520 uses a dual primary inductor, and thus may have a higher quality factor Q, compared to the legacy primary inductor.

According to an embodiment of the disclosure, a parasitic capacitor $C_{para}$ formed between the primary inductor and the secondary inductor may be formed to be coupled between an input stage and an output stage. In other words, the first structure 520 may include the $C_{para}$ formed between the first primary inductor out of the primary inductor and the secondary inductor. However, the first structure 520 may not include $C_{add}$ formed between the second primary inductor and the secondary inductor.

According to an embodiment of the disclosure, assuming that the transformer 510 of FIG. 5B is an equivalent circuit of the transformer 510 of FIG. 5A, the $C_1$ and the $C_2$ may be formed to have a specific relationship with the additional parasitic capacitor $C_{add}$ of FIG. 5A. The relationship between the $C_1$ and the $C_{add}$ is as shown in Equation 1 below.

$$C_1 = 0.5 C_{add}(1+A_v) \qquad \text{Equation 1}$$

$C_1$ denotes a first capacitor disposed at an input stage of the transformer, $C_{add}$ denotes an additional parasitic capacitor formed between the second primary inductor and the secondary inductor, and $A_v$ denote a voltage gain caused by the transformer. In this case, the voltage gain $A_v$, caused by the transformer may be $v_2/v_1$.

Such a relationship between the $C_1$ and the $C_{add}$ may be defined according to a Miller effect. The Miller effect means that an input impedance is related to an impedance coupled between the input and output stages of the amplifier and the voltage gain of the amplifier. In this case, the same may be applied to the transformer since voltage amplification is possible substantially.

In addition, the Equation 1 may be defined based on a relationship between the following Equations 2 and 3 defined according to a Kirchhoff's current law.

$$\frac{v_1 - (-v_2)}{\frac{1}{jw(C_{add} + C_{para})}} = \frac{-v_2}{R_{TR} \| C_{TR}} \qquad \text{Equation 2}$$

$v_1$ denotes a voltage at the input stage. $v_2$ denotes a voltage at the output stage. j is an imaginary unit of a complex number. w denotes an angular frequency of a signal. $C_{para}$ denotes a parasitic capacitor formed between the first primary inductor and the secondary inductor. $C_{add}$ denotes an additional parasitic capacitor formed between the second primary inductor and the secondary inductor. $R_{TR}$ denotes an equivalent resistor of the amplifier. $C_{TR}$ denotes an equivalent capacitor of the amplifier.

In FIG. 5A, an input current and an output current shall be formed to be identical according to a Kirchhoff's current law, and thus may be defined as in the Equation 2 above.

$$\frac{v_1 - (-v_2)}{\frac{1}{jwC_{para}}} + \frac{v_1}{\frac{1}{jwC_1}} = \frac{-v_2}{\frac{1}{jwC_2}} + \frac{-v_2}{R_{TR} \| C_{TR}} \qquad \text{Equation 3}$$

$v_1$ denotes a voltage at the input stage. $v_2$ denotes a voltage at the output stage. j is an imaginary unit of a complex number. w denotes an angular frequency of a signal. $C_{para}$ denotes a parasitic capacitor formed between the first primary inductor and the secondary inductor. $C_1$ denotes a first capacitor disposed to the input stage of the transformer. $C_2$ denotes a second capacitor disposed to the output stage of the transformer. $R_{TR}$ denotes an equivalent resistor of the amplifier. $C_{TR}$ denotes an equivalent capacitor of the amplifier.

Referring to FIG. 5B, an input current and an output current shall be formed to be identical according to a Kirchhoff's current law, and thus may also be defined as in the Equation 3 above.

Summarizing the relationship of Equations 2 and 3 above and considering that $C_1 v_1 = C_2 v_2$ since quantity of electric charge at the input stage is equal to quantity of electric charge at the output stage, the $C_1$ and the $C_{add}$ may have the relationship as shown in Equation 1. In addition, considering that $C_1 v_1 = C_2 v_2$ and $A_v = v_2/v_1$, it may be defined as $C_2 = C_1/A_v$.

As described above, the $C_1$ and $C_2$ of FIG. 5B may be determined based on the $C_{add}$ of FIG. 5A and a voltage gain caused by the transformer of the first structure 520. In addition, the $C_1$ may be coupled in parallel to the input stage similarly to $C_P$ of the transformer 200 of FIG. 2A, and the $C_2$ may be coupled in parallel to the output stage similarly to $C_S$ of the transformer 200 of FIG. 2A. Accordingly, the $C_1$ and the $C_2$ may be adjusted by regulating a value of the $C_{add}$ and the voltage gain caused by the transformer of the first structure 520.

In other words, in the dual primary inductor transformer structure according to an embodiment of the disclosure, the additional parasitic capacitor $C_{add}$ may be formed through the secondary primary inductor, and the $C_2$ may be adjusted based on the $C_{add}$ and the voltage gain of the transformer, thereby performing impedance matching with the $C_{TR}$ of the amplifier without having to dispose an additional element (e.g., a capacitor).

Hereinafter, it is described that an electronic device including a dual primary inductor transformer structure according to an embodiment of the disclosure may minimize a loss while having a similar frequency characteristic.

Figure 6A:
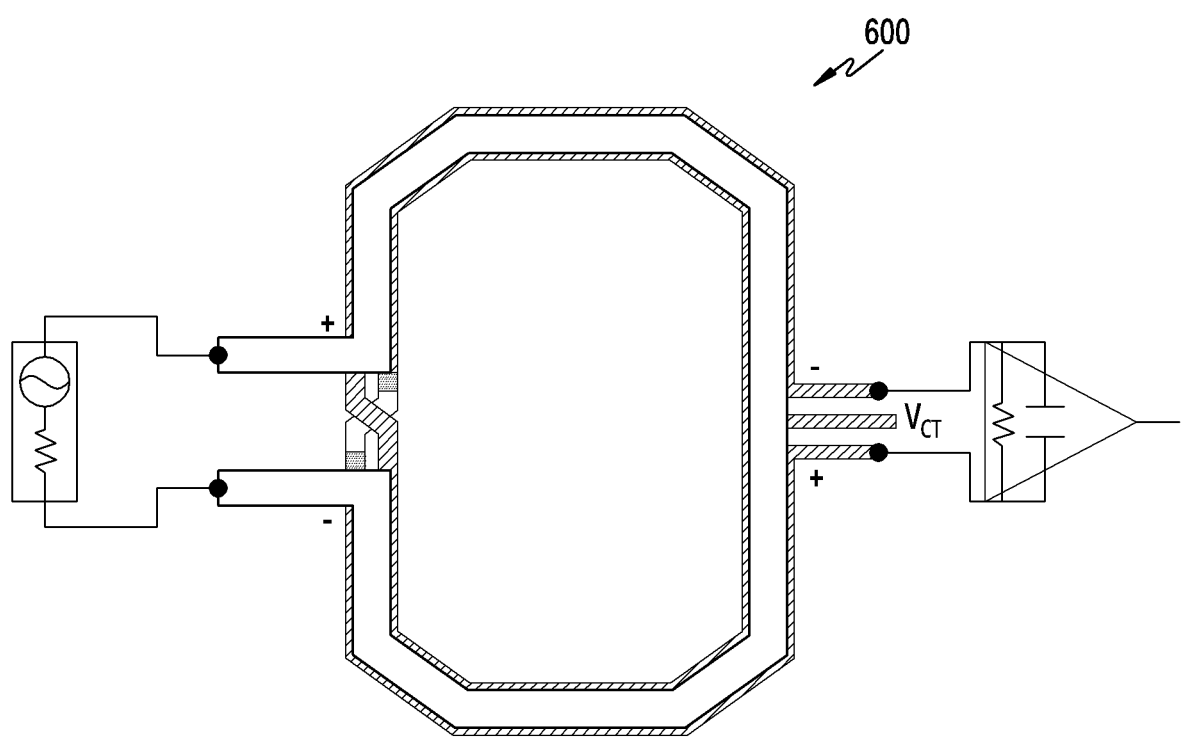
FIG. 6A illustrates a circuit diagram illustrating a structure of an electronic device according to an embodiment of the disclosure.

FIG. 6A illustrates a circuit diagram illustrating a structure of an electronic device according to an embodiment of the disclosure. For convenience of explanation, it is assumed in FIG. 6A that a resistance of an equivalent resistor of an amplifier is 700Ω, and a capacitance of an equivalent capacitor is 700fF.

Referring to FIG. 6A, the electronic device may include a transformer 600, a power unit coupled to an input stage of the transformer 600, and an amplifier coupled to an output stage of the transformer 600. According to an embodiment of the disclosure, the power unit may be replaced with an AC power source and an internal resistor. In addition, the amplifier may be replaced with an equivalent resistor and an equivalent capacitor which are coupled in parallel. According to an embodiment of the disclosure, the transformer 600 may imply a transformer formed by a dual primary inductor and a secondary inductor.

Hereinafter, a transformer's loss characteristic and frequency characteristic depending on a frequency band will be described with reference to FIG. 6A and FIG. 6C, by comparing the electronic device including the dual primary inductor transformer according to an embodiment of the disclosure and the electronic device including the legacy transformer structure.

Figure 6B:
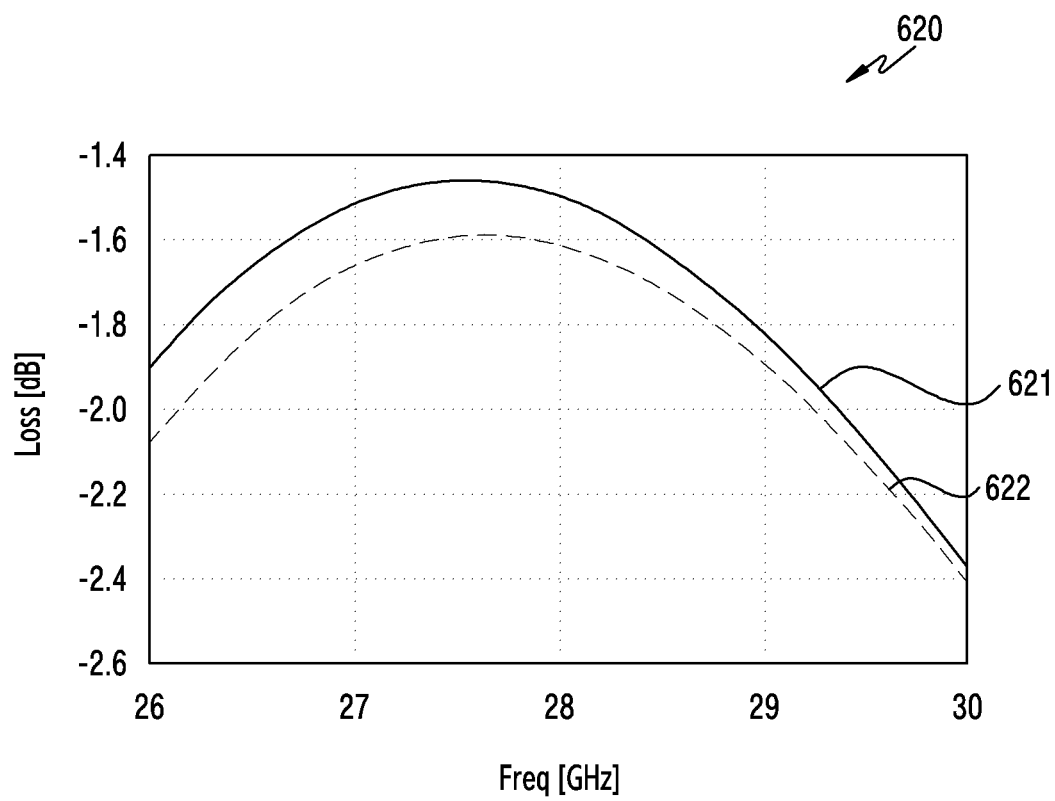
FIG. 6B is a graph illustrating performance of a transformer according to an embodiment of the disclosure.

FIG. 6B is a graph illustrating performance of a transformer according to an embodiment of the disclosure. A horizontal axis of a first graph 620 of FIG. 6B represents a frequency (unit: GHz), and a vertical axis of the first graph 620 represents a loss (unit: dB). For convenience of explanation, as shown in FIG. 6A, it is assumed that a resistance of an equivalent resistor of the amplifier is 700Ω, and a capacitance of an equivalent capacitor is 700ff. In addition, it is described under the assumption that the electronic device having the legacy transformer structure is impedance-matched with the amplifier by inserting a capacitor having a quality factor of 30 to the input stage and output stage of the transformer.

Referring to FIG. 6B, the first graph 620 illustrates a first line 621 representing a loss depending on a frequency band in the electronic device including the dual primary inductor transformer structure according to an embodiment of the disclosure and a second line 622 representing a loss depending on a frequency band in the electronic device having the legacy transformer structure.

Comparing the first line 621 and the second line 622, when a frequency is about 28 GHz, the first line 621 may be configured with a loss of about −1.5 dB. Unlike this, the second line 622 may be configured with a loss of about −1.6 dB. In addition, even if a frequency band is changed in the range of about 26 GHz to about 30 GHz, the first line 621 is configured with a lower loss than the second line 622. In other words, the dual primary inductor transformer according to an embodiment of the disclosure may minimize a loss by not adding an additional capacitor to the input stage and the output stage, compared to the legacy transformer.

Figure 6C:
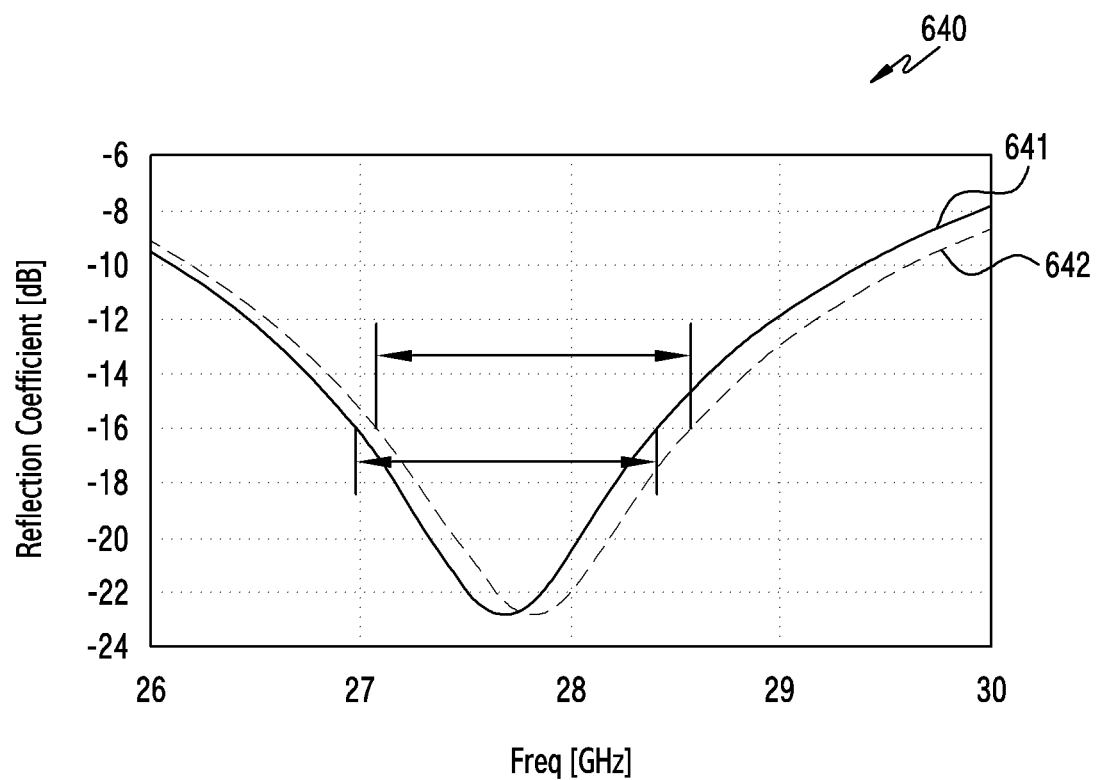
FIG. 6C is a graph illustrating performance of a transformer according to an embodiment of the disclosure.

FIG. 6C is a graph illustrating performance of a transformer according to an embodiment of the disclosure. A horizontal axis of a second graph 640 of FIG. 6C represents a frequency (unit: GHz), and a vertical axis of the second graph 640 represents a reflection coefficient (unit: dB). For convenience of explanation, as shown in FIG. 6A, it is assumed that a resistance of an equivalent resistor of the amplifier is 700Ω, and a capacitance of an equivalent capacitor is 700fF. In addition, it is described under the assumption that the electronic device having the legacy transformer structure is impedance-matched with the amplifier by inserting a capacitor having a quality factor of 30 to the input stage and output stage of the transformer.

Referring to FIG. 6C, the second graph 640 illustrates a third line 641 representing a reflection coefficient depending on a frequency band in the electronic device including the dual primary inductor transformer structure according to an embodiment of the disclosure and a fourth line 642 representing a reflection coefficient depending on a frequency band in the electronic device having the legacy transformer structure.

Comparing the third line 641 and the fourth line 642, when a frequency is about 27.8 GHz, the third line 641 may be configured with a reflection coefficient of about −22 dB, and the fourth line 642 may be configured with a reflection coefficient of about −23 dB. For example, even if a frequency band is changed, the reflection coefficient of the third line 641 is configured with a reflection coefficient similar to that of the fourth line 642. In addition, comparing the third line 641 and the fourth line 642 by focusing on a frequency bandwidth, when the reflection coefficient is based on −16 dB, the third line 641 may be configured with a frequency bandwidth of about 27 GHz to about 28.4 GHz, and the fourth line 642 may be configured with a frequency band of about 27.1 GHz to about 28.6 GHz. For example, when based on the same reflection coefficient, the frequency bandwidth of the third link 641 is configured with a frequency band similarly to that of the fourth link 642. Accordingly, the reflection coefficient may imply a matching characteristic of the transformer.

In other words, compared to the legacy transformer, the dual primary inductor transformer according to an embodiment of the disclosure may maintain a reflection coefficient depending on a frequency band without having to add an additional capacitor to the input stage and the output stage, and may have a similar matching characteristic.

Referring to FIG. 1 and FIG. 2B to FIG. 6C, the dual primary inductor transformer structure according to an embodiment of the disclosure may minimize a loss caused by impedance matching, compared to the legacy transformer. The legacy transformer requires a capacitor additionally disposed to an input stage to minimize leakage caused by mutual inductance between inductors inside the transformer, and requires a capacitor additionally disposed to an output stage for impedance matching with an amplifier (e.g., a differential amplifier) coupled to an output stage of the transformer. However, the capacitors additionally disposed may cause occurrence of a loss. Unlike this, the dual primary inductor transformer structure according to an embodiment of the disclosure may be impedance-matched with an amplifier through a parasitic capacitor formed when a primary inductor coupled to an input stage is added and a secondary inductor is disposed between primary inductors. Accordingly, since a capacitor is not additionally disposed, the dual primary inductor transformer structure according to an embodiment of the disclosure may minimize a loss.

In addition, the dual primary inductor transformer structure according to an embodiment of the disclosure may be designed more efficiently compared to the legacy transformer. In an electronic device including multiple radio frequency (RF) chains, a size of an amplifier shall be minimized in order to minimize power consumption. Since an input impedance of the small-sized amplifier may be formed with a relatively high value, it may be difficult for the small-sized amplifier to be directly impedance-matched with the transformer. To address this issue, a capacitor shall be disposed to an output stage of the transformer. Therefore, there may be a limitation in minimizing a size of the electronic device by additionally disposing the capacitor. However, the dual primary inductor transformer structure according to an embodiment of the disclosure may perform impedance matching with the amplifier by adjusting a characteristic of an inductor, a permittivity of a region between the inductors, an overlapping region between inductors, or the like, without having to additionally dispose the capacitor as described above. Accordingly, the size of the electronic device may be minimized, and in particular, more RFICs may be mounted inside one RF chain in a multi-chain system. For example, when a 1:2 transformer is used to couple with a small-sized amplifier used to transmit/receive a signal of an mmWave band, a size of the RFIC may be minimized, and a loss of the RFIC may be minimized.

According to an embodiment of the disclosure, since the dual primary inductor transformer structure according to an embodiment of the disclosure disposes a primary inductor in a dual manner, there is an advantage in that a resistance component caused by the primary inductor is coupled in parallel, thereby improving a quality factor of the primary inductor. In addition, since the dual primary inductor transformer structure according to an embodiment of the disclosure disposes the primary inductor in the dual manner, there is an advantage in that an inductance component of primary inductors is coupled in parallel, thereby improving a coupling factor between the primary inductors and a secondary inductor.

Figure 7:
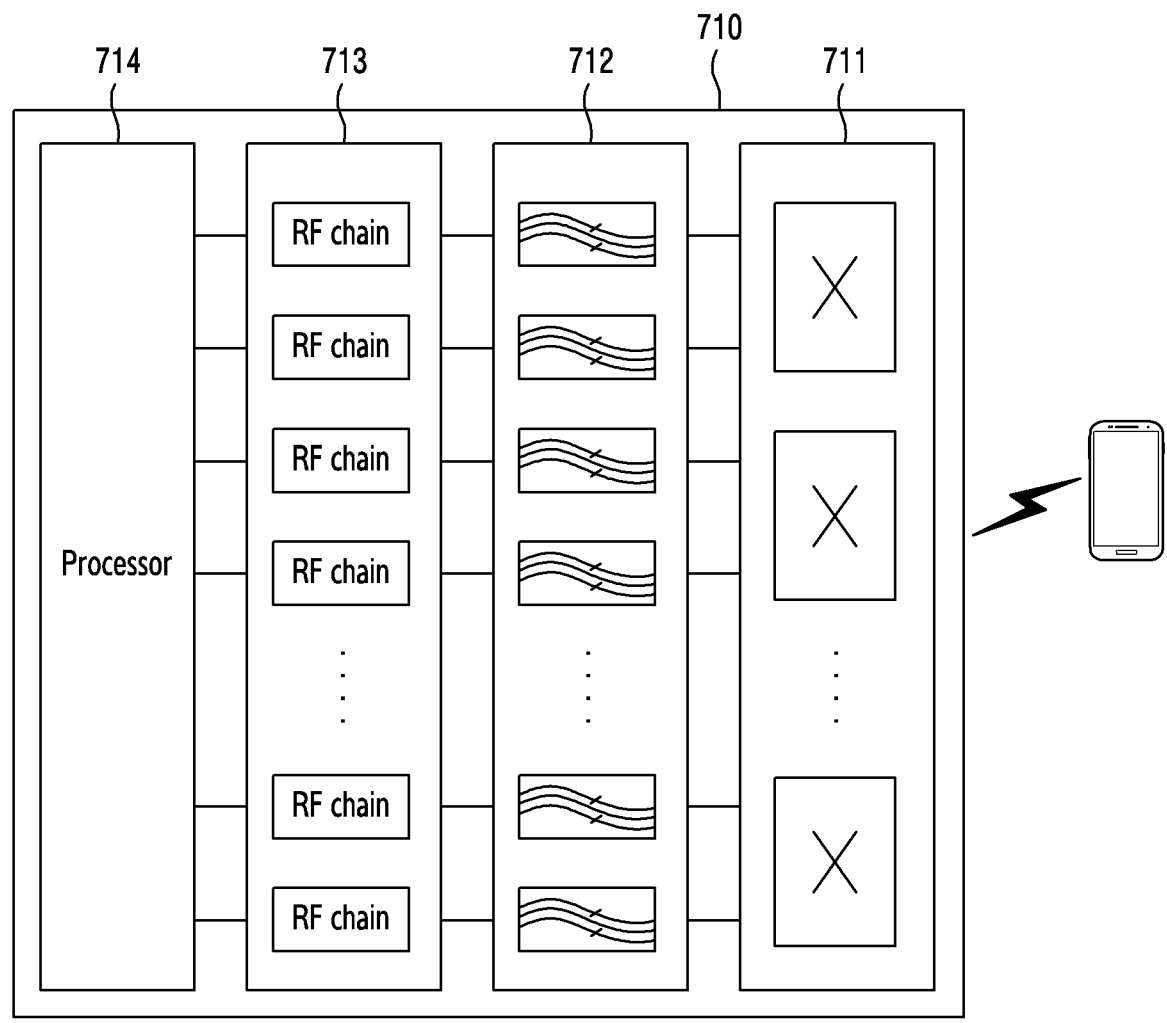
FIG. 7 illustrates a functional structure of an electronic device according to an embodiment of the disclosure.

FIG. 7 illustrates a functional structure of an electronic device according to an embodiment of the disclosure.

Referring to FIG. 7, a function structure of an electronic device 710 is illustrated. The electronic device 710 may include an antenna unit 711, a filter unit 712, a radio frequency (RF) processing unit 713, and a control unit 714.

The antenna unit 711 may include a plurality of antennas. The antenna performs functions for transmitting and receiving signals through a radio channel. The antenna may include a conductor formed on a substrate (e.g., a PCB) or a radiator formed of a conductive pattern. The antenna may radiate an up-converted signal on the radio channel or obtain a signal radiated by another device. Each antenna may be referred to as an antenna element or an antenna device. In some embodiments of the disclosure, the antenna unit 711 may include an antenna array (e.g., a sub array) in which a plurality of antenna elements constitute an array. The antenna unit 711 may be electrically coupled to the filter unit 712 through RF signal lines. The antenna unit 711 may be mounted on a PCB including a plurality of antenna elements. The PCB may include a plurality of RF signal lines to couple each antenna element and a filter of the filter unit 712. The RF signal lines may be referred to as a feeding network. The antenna unit 711 may provide the received signal to the filter unit 712 or may radiate the signal provided from the filter unit 712 into the air. An antenna having a structure according to the embodiment of the disclosure may be included in the antenna unit 711.

The antenna unit 711 according to various embodiments may include at least one antenna module having a dual polarization antenna. The dual polarization antenna may be, for example, a cross-pol (x-pol) antenna. The dual polarization antenna may include two antenna elements corresponding to different polarizations. For example, the dual polarization antenna may include a first antenna element having a polarization of +45° and a second antenna element having a polarization of −45°. It is obvious that the polarization may be formed of other polarizations orthogonal to each other, in addition to +45° and −45°. Each antenna element may be coupled to a feeding line, and may be electrically coupled to the filter unit 712, the RF processing unit 713, and the control unit 714 to be described later.

According to an embodiment of the disclosure, the dual polarization antenna may be a patch antenna (or a microstrip antenna). Since the dual polarization antenna has a form of a path antenna, it may be easily implemented and integrated as an array antenna. Two signals having different polarizations may be input to respective antenna ports. Each antenna port corresponds to an antenna element. For high efficiency, it is required to optimize a relationship between a co-pol characteristic and a cross-pol characteristic between the two signals having the different polarizations. In the dual polarization antenna, the co-pol characteristic indicates a characteristic for a specific polarization component and the cross-pol characteristic indicates a characteristic for a polarization component different from the specific polarization component.

The filter unit 712 may perform filtering to transmit a signal of a desired frequency. The filter unit 712 may perform a function for selectively identifying a frequency by forming a resonance. In some embodiments of the disclosure, the filter unit 712 may structurally form the resonance through a cavity including a dielectric. In addition, in some embodiments of the disclosure, the filter unit 712 may form a resonance through elements which form inductance or capacitance. In addition, in some embodiments of the disclosure, the filter unit 712 may include a bulk acoustic wave (BAW) filter or a surface acoustic wave (SAW) filter. The filter unit 712 may include at least one of a band pass filter, a low pass filter, a high pass filter, and a band reject filter. For example, the filter unit 712 may include RF circuits for obtaining a signal of a frequency band for transmission or a frequency band for reception. The filter unit 712 according to various embodiments may electrically couple the antenna unit 711 and the RF processing unit 713 to each other.

The RF processing unit 713 may include a plurality of RF paths. The RF path may be a unit of a path through which a signal received through an antenna or a signal radiated through the antenna passes. At least one RF path may be referred to as an RF chain. The RF chain may include a plurality of RF elements. The RF elements may include an amplifier, a mixer, an oscillator, a digital-to-analog Converter (DAC), an analog-to-digital converter (ADC), or the like. For example, the RF processing unit 713 may include an up converter which up-converts a digital transmission signal of a baseband to a transmission frequency, and a DAC which converts the converted digital transmission signal into an analog RF transmission signal. The converter and the DAC constitute a transmission path in part. The transmission path may further include a power amplifier (PA) or a coupler (or a combiner). In addition, for example, the RF processing unit 713 may include an ADC which converts an analog RF reception signal into a digital reception signal and a down converter which converts the digital reception signal into a digital reception signal of a baseband. The ADC and the down converter constitute a reception path in part. The reception path may further include a low-noise amplifier (LNA) or a coupler (or a divider). RF parts of the RF processing unit may be implemented on a PCB. The antennas and the RF components of the RF processing unit may be implemented on the PCB, and filters may be repeatedly fastened between one PCB and another PCB to constitute a plurality of layers.

A dual primary inductor transformer structure according to an embodiment of the disclosure may be included in the RF processing unit 713 of FIG. 7. For example, the RF processing unit 713 may include a radio frequency integrated circuit (RFIC), as an RF element for mmWave. According to an embodiment of the disclosure, the dual primary inductor transformer of the disclosure may be disposed on the RFIC, and may be disposed to a front stage of an amplifier (e.g., a differential amplifier) in the RFIC.

Due to the dual primary inductor transformer structure according to an embodiment of the disclosure, there is no need to additionally dispose a capacitor for impedance matching between the transformer and the amplifier, and a loss may be minimized. In addition, since the capacitor is not additionally disposed, an area occupied by the RF processing unit 713 inside the electronic device may be reduced. Accordingly, the electronic device may mount more RF components, or the electronic device may be reduced in size. Additionally, the area occupied by the RF processing unit 713 is reduced due to the dual primary inductor transformer structure according to an embodiment of the disclosure, thereby minimizing interference with neighboring RF components. Therefore, an additional process is not required, which facilitates mass production of the electronic device.

The control unit 714 may provide overall control to the electronic device 710. The control unit 714 may include various modules for performing communication. The control unit 714 may include at least one processor, such as a modem. The control unit 714 may include modules for digital signal processing. For example, the control unit 714 may include a modem. In data transmission, the control unit 714 generates complex symbols by encoding and modulating a transmission bit-stream. In addition, for example, in data reception, the control unit 714 restores a reception bit-stream by demodulating and decoding a baseband signal. The control unit 714 may perform functions of a protocol stack required in a communication standard.

The functional structure of the electronic device 710 is described in FIG. 7 as equipment to which a device according to various embodiments of the disclosure is applicable. However, the example of FIG. 7 is only a structure of a device for the structure according to various embodiments of the disclosure described with reference to FIG. 1 and FIG. 2B to FIG. 6C, and embodiments of the disclosure are not limited to components of the equipment of FIG. 7. Therefore, a transformer structure itself including a dual primary inductor and an electronic device including the structure may also be understood as an embodiment of the disclosure.

In addition, the disclosure is not limited to the structure illustrated in FIG. 2B to FIG. 6C. For example, although it is illustrated in FIG. 2B to FIG. 6C of the disclosure that the primary inductors have the same area, it is also possible to have different areas based on the parasitic capacitor as descried above. As another example, although it is illustrated that the primary inductors are disposed in parallel by being spaced apart by the same interval from the secondary inductor, it is also possible to be disposed with a different interval or disposed non-parallel. In other words, it may imply that the primary inductors and the secondary inductor may change in structure so that impedance matching is performed efficiently by adjusting a capacitance of the parasitic capacitor.

Although the transformer including the dual primary inductor and one secondary inductor is illustrated in FIG. 2B to FIG. 6B for convenience of explanation, the structure according to the disclosure is not limited thereto. For example, the transformer according to an embodiment of the disclosure may include one primary inductor and a dual secondary inductor. As another example, the transformer according to an embodiment of the disclosure may include at least three multiple primary inductors, instead of the dual primary inductor. As another example, the transformer according to an embodiment of the disclosure may include at least three multiple secondary inductors, instead of the dual secondary inductor.

A transformer according to an embodiment of the disclosure described above may include a first primary inductor, a second primary inductor, and a secondary inductor. The secondary inductor may be disposed between the first primary inductor and the second primary inductor. The secondary inductor may be disposed spaced apart from the first primary inductor and the second primary inductor.

In an embodiment of the disclosure, the secondary inductor may be disposed in parallel to the first primary inductor. The secondary inductor may be disposed in parallel to the second primary inductor.

In an embodiment of the disclosure, a first capacitor may be formed by the first primary inductor and the secondary inductor. A second capacitor may be formed by the second primary inductor and the secondary inductor.

In an embodiment of the disclosure, when an interval between the first primary inductor and the secondary inductor is a first distance and an interval between the second primary inductor and the secondary inductor is a second distance, a capacitance of the first capacitor may be related to the first distance, and a capacitance of the second capacitor may be related to the second distance.

In an embodiment of the disclosure, when a space between the first primary inductor and the secondary inductor is a first region and a space between the second primary inductor and the secondary inductor is a second region, a capacitance of the first capacitor may be related to a permittivity of the first region, and a capacitance of the second capacitor may be related to a permittivity of the second region.

In an embodiment of the disclosure, the first capacitor and the second capacitor may be related to metal constituting the first primary inductor, the second primary inductor, and the secondary inductor.

In an embodiment of the disclosure, a capacitance of the first capacitor may be formed to be equal to a capacitance of the second capacitor.

In an embodiment of the disclosure, the secondary inductor may be formed by at least one metal layer.

In an embodiment of the disclosure, the at least one metal layer may be formed of two metal layers.

In an embodiment of the disclosure, the transformer may further include a power amplifier coupled to the secondary inductor. A capacitor may be formed between the secondary inductor and the second primary inductor. The second primary inductor may be configured to achieve impedance matching between the capacitor and the power amplifier.

An electronic device of a wireless communication system may according to an embodiment of the disclosure described above may include a plurality of radio frequency integrated circuits (RFICs). At least one RFIC among the plurality of RFICs may include a transformer. The transformer may include a first primary inductor, a second primary inductor, and a secondary inductor. The secondary inductor may be disposed between the first primary inductor and the second primary inductor. The secondary inductor may be disposed spaced apart from the first primary inductor and the second primary inductor.

In an embodiment of the disclosure, the secondary inductor may be disposed in parallel to the first primary inductor. The secondary inductor may be disposed in parallel to the second primary inductor.

In an embodiment of the disclosure, a first capacitor may be formed by the first primary inductor and the secondary inductor. A second capacitor may be formed by the second primary inductor and the secondary inductor.

In an embodiment of the disclosure, when an interval between the first primary inductor and the secondary inductor is a first distance and an interval between the second primary inductor and the secondary inductor is a second distance, a capacitance of the first capacitor may be related to the first distance, and a capacitance of the second capacitor may be related to the second distance.

In an embodiment of the disclosure, when a space between the first primary inductor and the secondary inductor is a first region and a space between the second primary inductor and the secondary inductor is a second region, a capacitance of the first capacitor may be related to a permittivity of the first region, and a capacitance of the second capacitor may be related to a permittivity of the second region.

In an embodiment of the disclosure, the first capacitor and the second capacitor may be related to metal constituting the first primary inductor, the second primary inductor, and the secondary inductor.

In an embodiment of the disclosure, a capacitance of the first capacitor may be formed to be equal to a capacitance of the second capacitor.

In an embodiment of the disclosure, the secondary inductor may be formed by at least one metal layer.

In an embodiment of the disclosure, the at least one metal layer may be formed of two metal layers.

In an embodiment of the disclosure, the electronic device may further include a power amplifier coupled to the secondary inductor. A capacitor may be formed between the secondary inductor and the second primary inductor. The second primary inductor may be configured to achieve impedance matching between the capacitor and the power amplifier.

Methods based on the embodiments disclosed in the claims and/or specification of the disclosure may be implemented in hardware, software, or a combination of both.

When implemented in software, computer readable recording medium for storing one or more programs (i.e., software modules) may be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (i.e., the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), a digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network, such as the Internet, an Intranet, a local area network (LAN), a wide LAN (WLAN), or a storage area network (SAN) or a communication network configured by combining the networks. The storage device may have an access to a device for performing an embodiment of the disclosure via an external port. In addition, an additional storage device on a communication network may have an access to the device for performing the embodiment of the disclosure.

In the aforementioned specific embodiments of the disclosure, a component included in the disclosure is expressed in a singular or plural form according to the specific embodiment proposed herein. However, the singular or plural expression is selected properly for a situation proposed for the convenience of explanation, and thus the various embodiments of the disclosure are not limited to a single or a plurality of components. Therefore, a component expressed in a plural form may also be expressed in a singular form, or vice versa.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A transformer comprising:
a first primary inductor;
a second primary inductor;
a secondary inductor; and
a power amplifier coupled with the secondary inductor,
wherein the secondary inductor is disposed between the first primary inductor and the second primary inductor,
wherein the secondary inductor is disposed apart from the first primary inductor and the second primary inductor,
wherein a first parasitic capacitor is formed by the first primary inductor and the secondary inductor,
wherein a second parasitic capacitor is formed by the second primary inductor and the secondary inductor, and
wherein the second parasitic capacitor is impedance-matched with an equivalent capacitor of the power amplifier.

2. The transformer of claim 1,
wherein the secondary inductor is disposed in parallel to the first primary inductor, and
wherein the secondary inductor is disposed in parallel to the second primary inductor.

3. The transformer of claim 1, wherein, when an interval between the first primary inductor and the secondary inductor is a first distance and an interval between the second primary inductor and the secondary inductor is a second distance, a capacitance of the first parasitic capacitor is related to the first distance, and a capacitance of the second parasitic capacitor is related to the second distance.

4. The transformer of claim 1, wherein, when a space between the first primary inductor and the secondary inductor is a first region and a space between the second primary inductor and the secondary inductor is a second region, a capacitance of the first parasitic capacitor is related to a permittivity of the first region, and a capacitance of the second parasitic capacitor is related to a permittivity of the second region.

5. The transformer of claim 1, wherein the first parasitic capacitor and the second parasitic capacitor are related to metal constituting the first primary inductor, the second primary inductor, and the secondary inductor.

6. The transformer of claim 1, wherein a capacitance of the first parasitic capacitor is formed to be equal to a capacitance of the second parasitic capacitor.

7. The transformer of claim 1,
wherein the secondary inductor includes a first layer and a second layer,
wherein the first and second layers of the secondary inductor are disposed apart from one another,
wherein the first layer of the secondary inductor is disposed between the first primary inductor and the second layer of the secondary inductor,
wherein the second layer of the secondary inductor is disposed between the first layer of the secondary inductor and the second primary inductor,
wherein the first layer of the secondary inductor is disposed apart from the first primary inductor, and
wherein the second layer of the secondary inductor is disposed apart from the second primary inductor.

8. The transformer of claim 7, wherein the first layer and the second layer are metal layers.

9. An electronic device in a wireless communication system, the electronic device comprising:
a plurality of radio frequency integrated circuits (RFICs),
wherein at least one RFIC among the plurality of RFICs includes a transformer,
wherein the transformer includes a first primary inductor, a second primary inductor, a secondary inductor, and a power amplifier coupled with the secondary inductor,
wherein the secondary inductor is disposed between the first primary inductor and the second primary inductor,
wherein the secondary inductor is disposed apart from the first primary inductor
and the second primary inductor,
wherein a first parasitic capacitor is formed by the first primary inductor and the secondary inductor,
wherein a second parasitic capacitor is formed by the second primary inductor and the secondary inductor, and
wherein the second parasitic capacitor is impedance-matched with an equivalent capacitor of the power amplifier.

10. The electronic device of claim 9,
wherein the secondary inductor is disposed in parallel to the first primary inductor, and
wherein the secondary inductor is disposed in parallel to the second primary inductor.

11. The electronic device of claim 9, wherein, when an interval between the first primary inductor and the secondary inductor is a first distance and an interval between the second primary inductor and the secondary inductor is a second distance, a capacitance of the first parasitic capacitor is related to the first distance, and a capacitance of the second parasitic capacitor is related to the second distance.

12. The electronic device of claim 9, wherein, when a space between the first primary inductor and the secondary inductor is a first region and a space between the second primary inductor and the secondary inductor is a second region, a capacitance of the first parasitic capacitor is related to a permittivity of the first region, and a capacitance of the second parasitic capacitor is related to a permittivity of the second region.

13. The electronic device of claim 9, wherein the first parasitic capacitor and the second parasitic capacitor are related to metal constituting the first primary inductor, the second primary inductor, and the secondary inductor.

14. The electronic device of claim 9, wherein a capacitance of the first parasitic capacitor is formed to be equal to a capacitance of the second parasitic capacitor.

15. The electronic device of claim 9,
wherein the secondary inductor includes a first layer and a second layer,
wherein the first and second layers of the secondary inductor are disposed apart from one another,
wherein the first layer of the secondary inductor is disposed between the first primary inductor and the second layer of the secondary inductor,
wherein the second layer of the secondary inductor is disposed between the first layer of the secondary inductor and the second primary inductor,
wherein the first layer of the secondary inductor is disposed apart from the first primary inductor, and
wherein the second layer of the secondary inductor is disposed apart from the second primary inductor.

16. The electronic device of claim 15, wherein the first layer and the second layer are at least one metal layer is formed of two metal layers.

\* \* \* \* \*